United States Patent
Matsuda et al.

(10) Patent No.: US 7,868,286 B2
(45) Date of Patent: Jan. 11, 2011

(54) MOUNTED IMAGING DEVICE

(75) Inventors: Kenichi Matsuda, Kyoto (JP); Yuuichi Inaba, Osaka (JP); Shinji Yoshida, Osaka (JP); Takumi Yamaguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/427,332

(22) Filed: Apr. 21, 2009

(65) Prior Publication Data

US 2009/0201371 A1    Aug. 13, 2009

Related U.S. Application Data

(62) Division of application No. 11/795,791, filed as application No. PCT/JP2006/304368 on Mar. 7, 2006, now Pat. No. 7,560,684.

(30) Foreign Application Priority Data

Mar. 23, 2005  (JP)  ............................... 2005-083104

(51) Int. Cl.
   *H01J 40/14*     (2006.01)
(52) U.S. Cl. .................... 250/226; 250/208.1; 257/440; 348/272; 349/106; 356/402; 356/419
(58) Field of Classification Search ................. 250/226, 250/208.1; 257/440; 348/272; 356/402, 356/419; 349/106
   See application file for complete search history.

(56) References Cited

U.S. PATENT DOCUMENTS

| 5,737,040 | A | * | 4/1998 | Ichikawa et al. ............... 349/9 |
| 6,097,023 | A | | 8/2000 | Schofield et al. |
| 7,109,649 | B2 | | 9/2006 | Kato et al. |
| 7,121,669 | B2 | | 10/2006 | Iisaka |

FOREIGN PATENT DOCUMENTS

| JP | 57-100404 | | 6/1982 |
| JP | 5-294183 | | 11/1993 |
| JP | 2000-75277 | | 3/2000 |
| JP | 2001-71558 | | 3/2001 |
| JP | 2002-290788 | * | 4/2002 |
| JP | 2003-285722 | | 10/2003 |

\* cited by examiner

*Primary Examiner*—Seung C Sohn
(74) *Attorney, Agent, or Firm*—McDermott Will & Emery LLP

(57) ABSTRACT

A vehicle-mounted imaging device that is mounted in an automobile and performs color imaging has been provided with a plurality of two-dimensionally arranged pixel cells. In each of the pixels, a color filter separates incident light by a multilayer interference filter. The multilayer interference filter is composed of two $\lambda/4$ multilayer films and a spacer layer sandwiched therebetween. The multilayer interference filter transmits light in a wavelength region that corresponds to an optical thickness of the spacer layer. The $\lambda/4$ multilayer films and spacer layer are composed of inorganic materials.

3 Claims, 15 Drawing Sheets

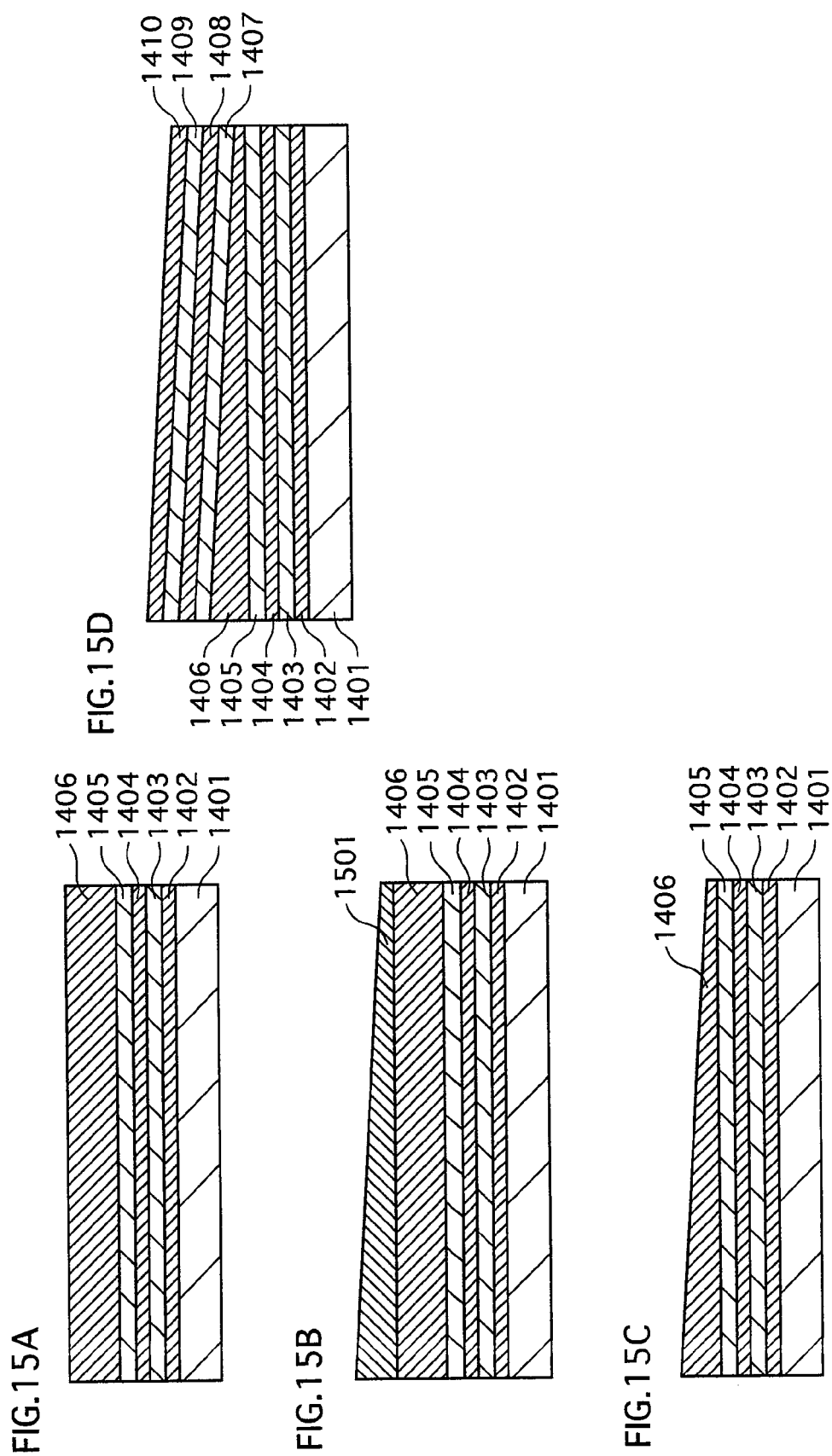

MOUNTED IMAGING DEVICE

RELATED APPLICATIONS

This application is a Divisional of U.S. patent application Ser. No. 11/795,791, filed Jul. 23, 2007 now U.S. Pat. No. 7,560,684, which is a U.S. National Phase under 35 U.S.C. §371 of International Application No. PCT/JP2006/304368, filed on Mar. 7, 2006, which in turn claims the benefit of Japanese Application No. 2005-083104, filed on Mar. 23, 2005, the disclosures of which Applications are incorporated by reference herein.

TECHNICAL FIELD

The present invention relates to a vehicle-mounted imaging device, and in particular to technology for improving environment resistance properties of the vehicle-mounted imaging device.

BACKGROUND ART

In recent years, as the computerization of automobiles has been progressing, there has been continuing development of technology for providing information to drivers and aiding control of automobiles by imaging a periphery of a vehicle with the use of video cameras and analyzing the obtained video.

For example, patent document 1 discloses a vehicle-mounted monitoring camera device that, for example, images the rear of a vehicle and a condition of the road and presents the images to a driver. FIG. 1 shows a structure of the vehicle-mounted monitoring camera device. As shown in FIG. 1, a vehicle-mounted monitoring camera device 1 includes a lens 101 with an optical filter attached, an imaging device 102, a cable 103, a camera signal processing circuit 104, a monitor 105, and an image recognition circuit 106.

The optical-filter-attached lens 101 and the imaging device 102 are stored in a side view mirror 110 of the automobile, and imaging is performed through a half-mirror 111.

Accordingly, given that neither the lens 101 nor the imaging device 102 are disposed in the passenger compartment, the aesthetic design and comfort of the passenger compartment are not diminished, and the driver's field of vision is not blocked. Also, environmental conditions such as vibration and heat are more favorable in this case than when the lens 101 and imaging device 102 are disposed in the engine compartment, and therefore malfunctions do not readily occur. Furthermore, given that the lens 101 and imaging device 102 are not disposed on a surface of the vehicle body, there is no increase in aerodynamic resistance, and a preferable aesthetic design is maintained.

Patent document 1: Japanese Patent Application Publication No. H05-294183 (FIG. 1 and FIG. 7)

DISCLOSURE OF THE INVENTION

Problems Solved by the Invention

However, it is common knowledge that very high temperatures are reached even inside a side view mirror when, for example, an automobile is parked under the scorching sun in midsummer, and the temperature inside the side view mirror is far colder than in the passenger compartment in cold regions. Also, the use environment is even harsher when the imaging device is mounted on the surface of the vehicle body. In other words, changing where the imaging device is mounted does not change the fact that it is in a harsh use environment.

Given that imaging devices pertaining to conventional technology use organic pigment-based color filters for color imaging, when such imaging devices are left in high-temperature conditions for long periods of time or exposed to intense incident light, a chemical change in the organic pigment is induced, and the wavelength selection properties of the color filter change. In other words, there are problems such as degradation in the color separation properties (color fading), and degradation in color reproducibility when color imaging is performed, and organic pigment-based color filters therefore cannot stand up to practical use.

It is certainly necessary to solve the problem of color fading, particularly in the case of driving assistance in which it is desirable to display video of road signs, pedestrians, obstacles, etc. to the driver in color.

The present invention has been achieved in light of the above-described problems, and aims to provide a vehicle-mounted imaging device that has superior environment resistance properties.

Means to Solve the Problems

In order to achieve the above aim, the present invention is a vehicle-mounted imaging device that is mounted to an automobile and performs color imaging, the vehicle-mounted imaging device including a plurality of two-dimensionally arranged pixel cells, in each of which a color filter selectively transmits a wavelength of incident light, wherein the color filter is composed of an inorganic material.

EFFECTS OF THE INVENTION

This structure enables the realization of environment resistance properties that are superior to a case of using organic materials in the color filter. Accordingly, the present invention can be disposed regardless of the use environment, that is, on the outer surface of the automobile, in the passenger or engine compartment, and the like.

Also, the color filter may include two $\lambda/4$ multilayer films and a spacer layer sandwiched therebetween, each of the $\lambda/4$ multilayer films may include two types of dielectric layers that have been alternately laminated, each type of dielectric layer having a same optical thickness and a different refractive index, and in each pixel cell, the color filter may selectively transmit light in a wavelength region that corresponds to a film thickness of the spacer layer in the pixel cell. The thickness of a color filter with this structure can be reduced to a much greater degree than a color filter that uses organic materials, thereby making the present invention suitable for use in a vehicle in which the imaging apparatus must be mounted in a limited space.

Also, the transmission band can be changed by merely adjusting the optical thickness of the spacer layer, thereby reducing the number of processing steps when manufacturing the color filter by a semiconductor process, and enabling affordable mass-production.

In this case, in at least one of the pixel cells, the color filter may have been formed without the spacer layer in accordance with the wavelength region of light to be transmitted by the at least one pixel cell.

Also, mounting the vehicle-mounted imaging device in a passenger or engine compartment of the automobile is effective for keeping a video record of conditions during a vehicular accident since the vehicle-mounted imaging device would not readily be damaged during the accident.

Also, although the influence of direct sunlight can be mitigated if the camera is disposed in the side view mirror such as in conventional technology, the camera is still subjected to high temperatures. Furthermore, the sensitivity of the camera is reduced since imaging is performed through a half-mirror, thereby lowering image quality, and the panning angle and tilt angle are limited, thereby reducing the field of view that can be imaged. Also, if the side view mirrors were removed for the sake of design, there would be nowhere for the camera to be disposed.

In contrast, the vehicle-mounted imaging device of the present invention has superior environment resistance properties, as a result of which there is no degradation in color separation properties even when subjected to high temperatures etc. Therefore, there is no need to perform imaging through a half-mirror since the present invention can be disposed anywhere, thereby eliminating the degradation in sensitivity that arises from imaging through a half-mirror.

BRIEF DESCRIPTION OF THE DRAWINGS

FIG. 5A is a graph showing exemplary transmissivity properties of the entire color filter 306, and FIG. 5B is a graph showing exemplary transmissivity properties of only portions of the color filter 306 that include $\lambda/4$ multilayer films 410 and 411;

FIGS. 15A to 15D show cross-sectional views of a color filter 14 pertaining to embodiment 5 of the present invention, during steps in a manufacturing method for the color filter 14.

Figure 1:
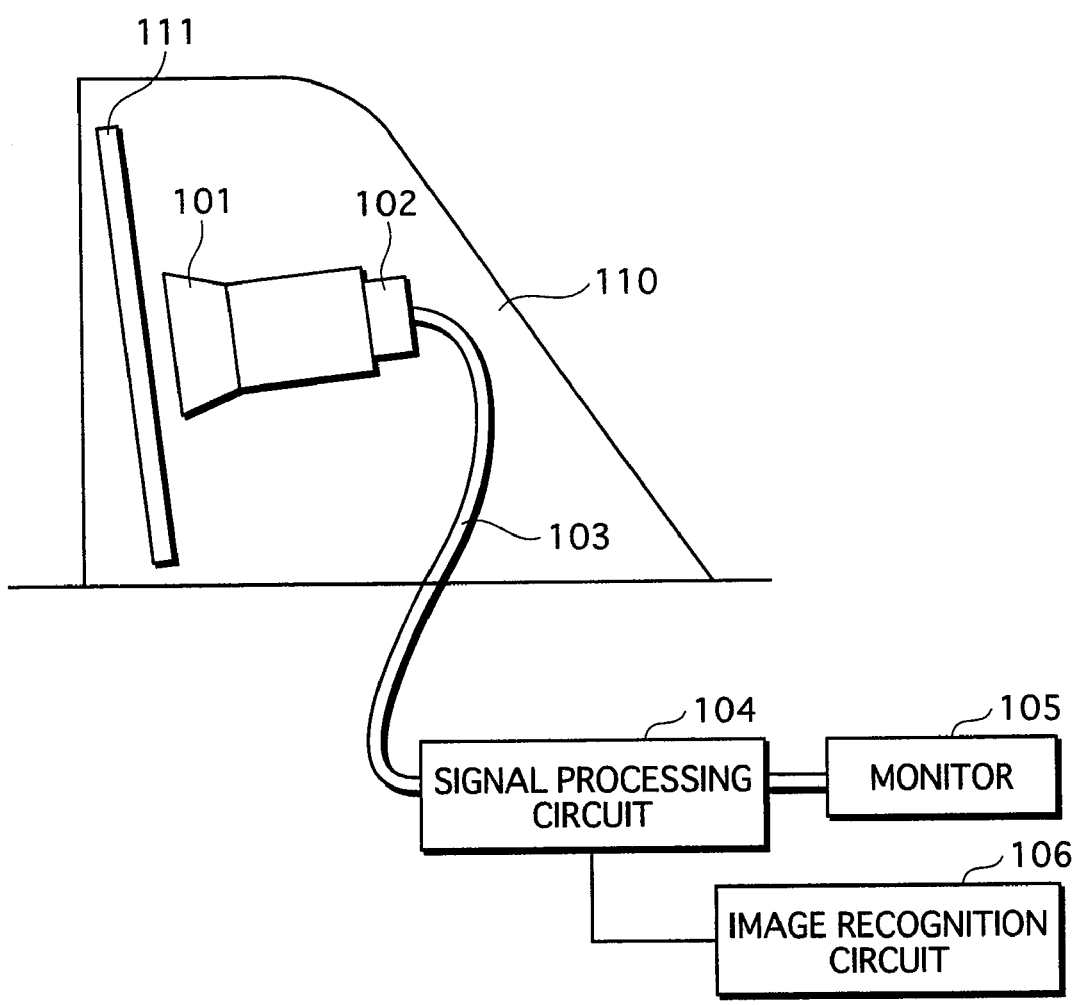
FIG. 1 shows a structure of a vehicle-mounted monitoring camera device pertaining to conventional technology.

DESCRIPTION OF THE CHARACTERS 1 vehicle-mounted monitoring camera device
2 driving assistance system
3, 102 imaging device
9, 12, 14, 306 color filter
101 lens with optical filter
103 cable
104 camera signal processing circuit
105 monitor
106 image recognition circuit
110 side view mirror
111 half-mirror
201 front camera
202 side camera
203 rear camera
204 passenger compartment camera
205 engine compartment camera
206 video control device
207 video display device
210 passenger vehicle
301 N-type semiconductor substrate
302 P-type semiconductor layer
303 photodiode
304, 801, 901, 1201, 1401 interlayer insulation film
305 light shielding film
307 microlens
401 silicon nitride layer
402 silicon oxide layer
410, 411 $\lambda/4$ multilayer film
601, 602, 807, 1001 to 1003 resist pattern
1301 to 1303, 1501 resist pattern
802 to 806, 808 to 811, 902 to 910 dielectric layer
1202 to 1210, 1402 to 1410 dielectric layer

BEST MODE FOR CARRYING OUT THE INVENTION

Embodiments of a vehicle-mounted imaging device pertaining to the present invention are described below, taking the example of a driving assistance system, with reference to the drawings.

Embodiment 1

A driving assistance system pertaining to embodiment 1 of the present invention is characterized by including an imaging device in which inorganic materials are used in a color filter used for color imaging.

1. Structure of the Driving Assistance System

Figure 2:
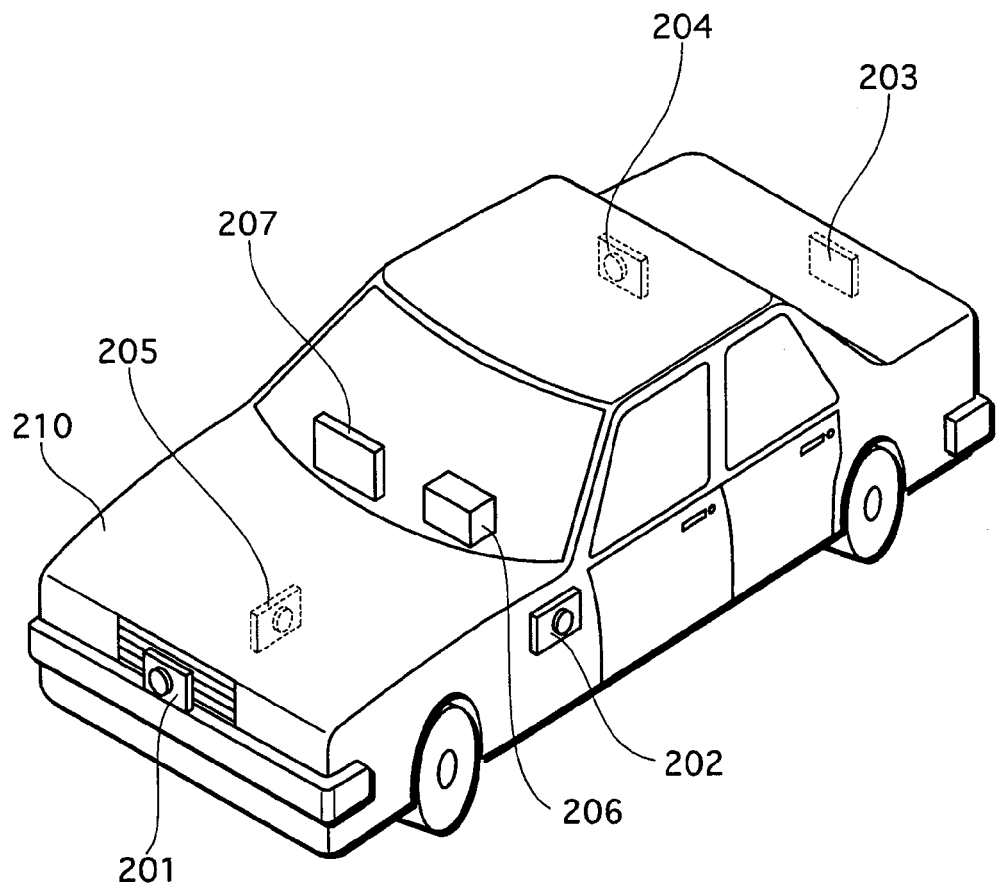
FIG. 2 is an external perspective view of a passenger vehicle provided with a driving assistance system pertaining to embodiment 1 of the present invention.

FIG. 2 is an external perspective view of a passenger vehicle provided with the driving assistance system pertaining to the present embodiment. As shown in FIG. 2, a driving assistance system 2 includes a front camera 201, a side camera 202, a rear camera 203, a passenger compartment camera 204, an engine compartment camera 205, a video control device 206, and a video display device 207. Also, the driving assistance system 2 is provided in a passenger vehicle 210.

Video signals output by the cameras 201 to 205 are input to the video control device 206. The video control device 206 causes the video display device 207 to display video captured by any of the cameras 201 to 205, and causes a plurality of videos to be displayed simultaneously. The video control device 206 also processes the received video signals to measure an inter-vehicular distance with vehicles in front of, behind, and next to the passenger vehicle 210, and issues alerts as necessary.

The video control device 206 processes video signals from the passenger compartment camera 204 to determine whether the driver is driving while asleep or intoxicated. The video control device 206 also records video signals while the passenger vehicle 210 is parked, to keep evidence of a car break-in and issue an alert.

Furthermore, the image control device 206 processes video signals from the camera in the engine compartment to monitor the condition of the engine, transmission, suspension, tires, and the like. Also, upon discovering an abnormality in the engine compartment, the video control device 206 issues an alert and causes the video display device 207 to display video of the engine compartment.

The video display device 207 is disposed in the vicinity of the driver seat so as to be clearly visible by the driver. This enables the fender mirror, side view mirrors, and rear view mirror to be replaced by the cameras 201 to 205. In turn, this makes it possible to more freely design automobiles since such mirrors are no longer necessary.

2. Structure of the Imaging Device

The following describes a structure of the imaging device that includes the cameras 201 to 205. The imaging device is a so-called solid-state imaging device, and performs color imaging using a plurality of two-dimensionally arranged pixels.

Figure 3:
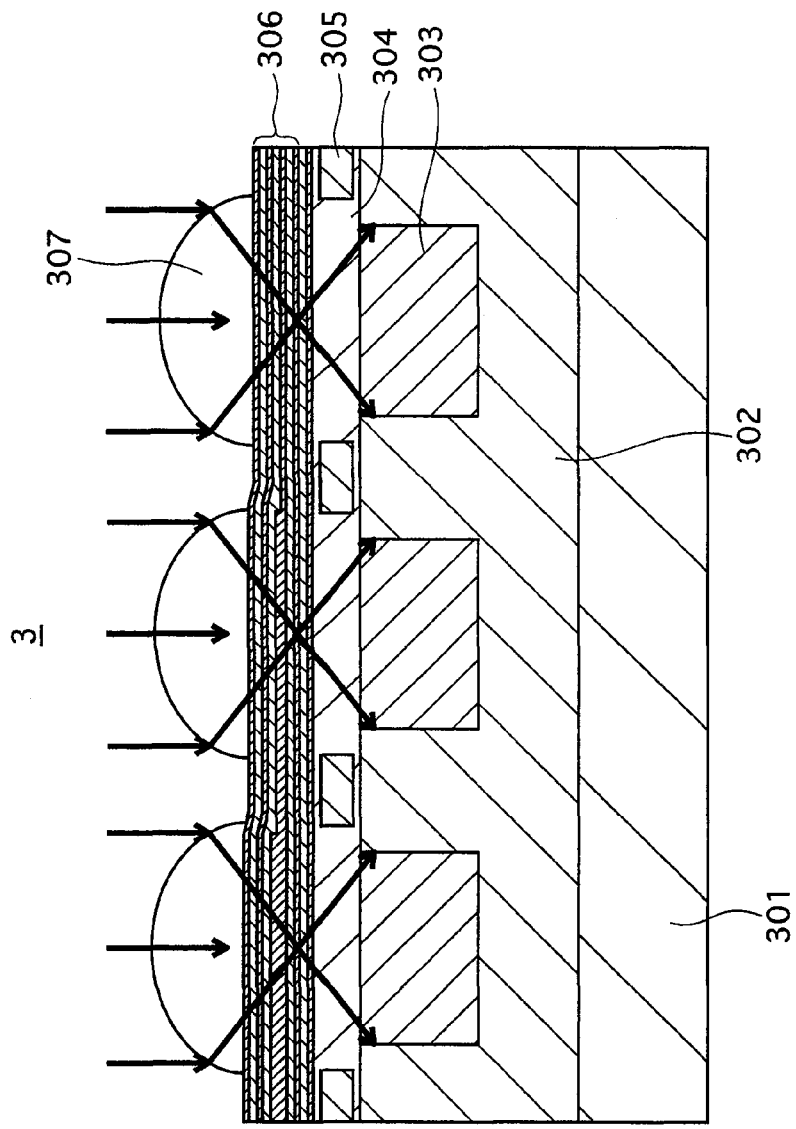
FIG. 3 is a cross-sectional view of a structure of a pixel portion of an imaging device pertaining to embodiment 1 of the present invention.

FIG. 3 is a cross-section showing a structure of a pixel portion of the imaging device pertaining to the present embodiment. As shown in FIG. 3, an imaging device 3 includes an N-type semiconductor substrate 301 on which a P-type semiconductor layer 302, an interlayer insulation film 304, a color filter 306, and microlenses 307 have been successively formed.

In each pixel, a photodiode 303 has been formed in the P-type semiconductor layer 302 on the interlayer insulation film 304 side thereof by the injection of N-type impurity ions. The photodiodes 303 generate charges according to the amount of incident light. The photodiodes 303 are separated from each other by element separation areas of the P-type semiconductor layer 302.

Also, light shielding films 305 are provided in the interlayer insulation film 304 above the element separation areas. The light shielding films 305 prevent light that has passed through the color filter 306 from incidenting on the photodiode 303 of a non-corresponding photodiode 303, and also functions as electrical wiring.

Portions of the color filter 306 selectively transmit red, green or blue light according to the pixel above which they are disposed. The colors of light to be transmitted are arranged in the Bayer pattern. Hereinafter, a portion of the color filter 306 that selectively transmits red light is called a "red portion". Also, a portion of the color filter 306 that selectively transmits green light is called a "green portion", and a portion of the color filter 306 that selectively transmits blue light is called a "blue portion".

A microlens 307 has been provided in each pixel, and focuses incident light onto a corresponding photodiode 303.

3. Structure and Properties of the Color Filter 306

The following describes the structure and properties of the color filter 306.

Figure 4:
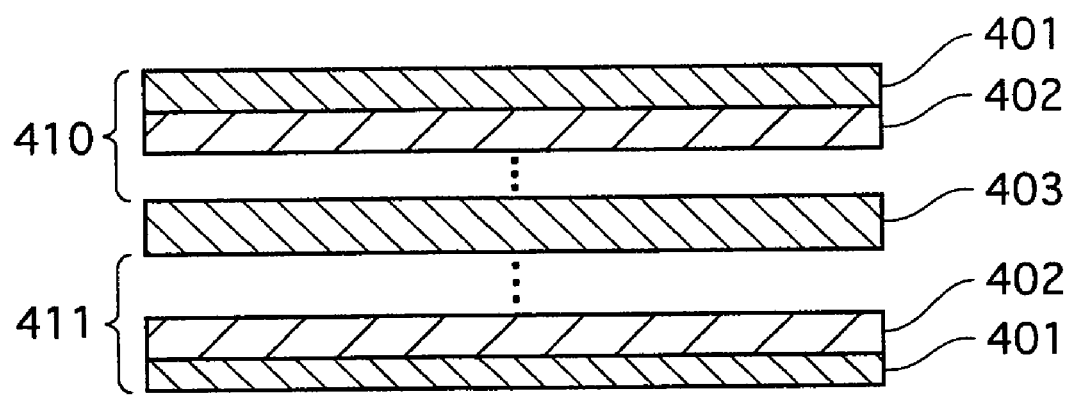
FIG. 4 shows a structure of a color filter 306 pertaining to embodiment 1 of the present invention.

FIG. 4 shows the structure of the color filter 306. As shown in FIG. 4, the color filter 306 is a multilayer interference filter in which a spacer layer 403 composed of silicon nitride (SiN) is sandwiched between $\lambda/4$ multilayer films 410 and 411 that include alternately laminated silicon nitride layers 401 and silicon oxide ($SiO_2$) layers 402.

The $\lambda/4$ multilayer films 410 and 411 both include two silicon nitride layers 401 and two silicon oxide layers 402. Both the silicon nitride layers 401 and the silicon oxide layers 402 have an optical thickness of 137.5 nm. Note that the optical thickness refers to a value obtained by multiplying the refractive index of the material composing the layer by the physical thickness of the layer. The film thickness of the spacer layer 403 differs according to the color of light to be transmitted by the color filter 306.

Figure 5A:
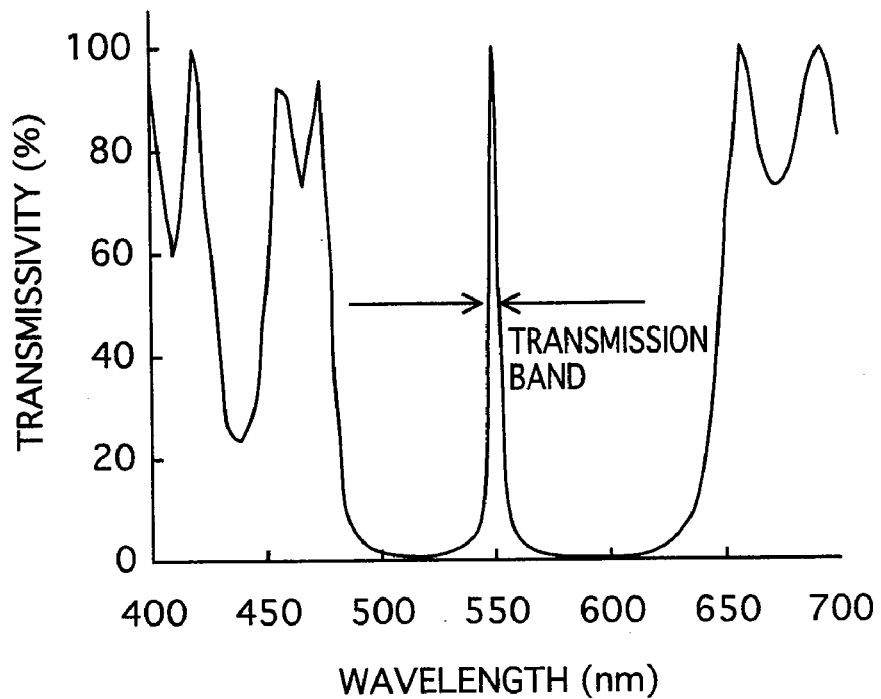
FIGS. 5A and 5B show transmissivity properties of the color filter 306 pertaining to embodiment 1 of the present invention, where
Figure 5B:
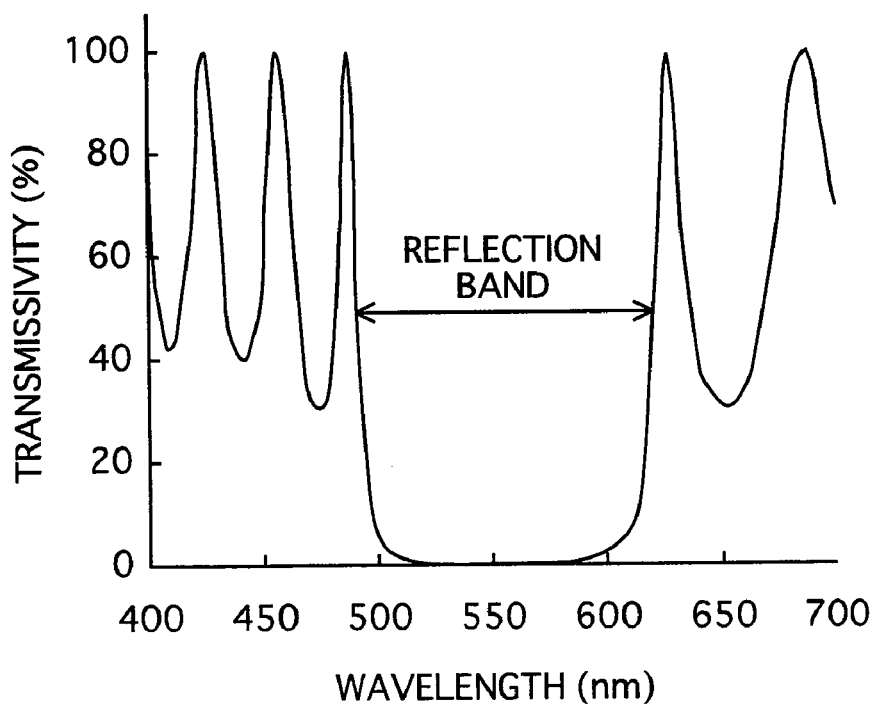

FIGS. 5A and 5B show the transmissivity properties of the color filter 306, where FIG. 5A is a graph showing exemplary transmissivity properties of the entire color filter 306, and FIG. 5B is a graph showing exemplary transmissivity properties of only the $\lambda/4$ multilayer film 410 and 411 portions of the color filter 306.

As shown in FIG. 5A, the color filter 306 transmits light with wavelengths in the vicinity of 550 nm (i.e., the transmission band), and reflects light with wavelengths from 500 nm up to the lower limit of the transmission band, and from the upper limit of the transmission band up to 630 nm. Although FIG. 5A shows the transmissivity properties of the color filter 306 in an exemplary case in which the spacer layer 403 has a film thickness of 542 nm, the position of the transmission band differs according to the film thickness of the spacer layer 403.

In contrast, in the case of only the $\lambda/4$ multilayer films 410 and 411 as shown in FIG. 5B, instead of a transmission band, light is reflected in a reflection band centered around a wavelength four times the optical thickness of the layers (hereinafter, called the "set central wavelength").

Note that the reflection band of the $\lambda/4$ multilayer films becomes wider the greater the difference is between the refractive indices of the two types of dielectric layers constituting the $\lambda/4$ multilayer films. For example, when using titanium oxide ($TiO_2$) that has a refractive index of 2.5 and silicon oxide that has a refractive index of 1.45 as the dielectric layer materials, the reflection band is wide since there is a large difference between the refractive indices.

Note that the above-described transmissivity properties were obtained with the use of a matrix method that uses a Fresnel coefficient in the case of 10 pairs of layers in the $\lambda/4$ multilayer films (at total of 20 layers), and only perpendicularly incident light was taken into account.

4. Manufacturing Method for the Color Filter 306

The following describes a manufacturing method for the color filter 306.

FIGS. 6A to 6D are schematic views of steps in a manufacturing method for the color filter 306 pertaining to the present embodiment, where the manufacturing steps proceed from FIG. 6A to 6D. Note that although the number of layers in the $\lambda/4$ multilayer films has been reduced in this description for the sake of convenience, the same manufacturing method can be used regardless of the number of layers. Also, depictions of constituent elements other than the color filter and the interlayer insulation film 304 have been omitted.

Figure 6A:
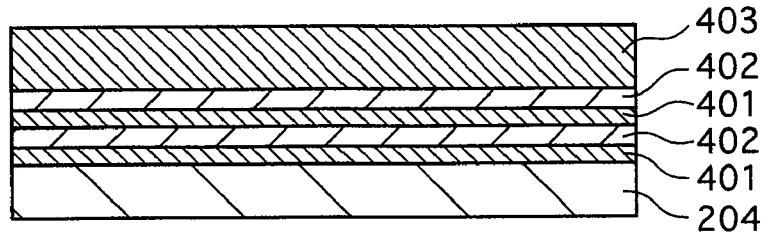
FIGS. 6A to 6D are schematic views showing steps in a manufacturing method for the color filter 306 pertaining to embodiment 1 of the present invention.

First, as shown in FIG. 6A, a high frequency sputter device is used to alternately laminate the silicon nitride layers 401 and the silicon oxide layers 402 on the interlayer insulation film 304, and further form the silicon nitride layer 403 thereon. The silicon nitride layers 401 and the silicon oxide layers 402 form the $\lambda/4$ multilayer film 411. Also, the silicon nitride layer 403 forms the spacer layer.

Figure 6B:
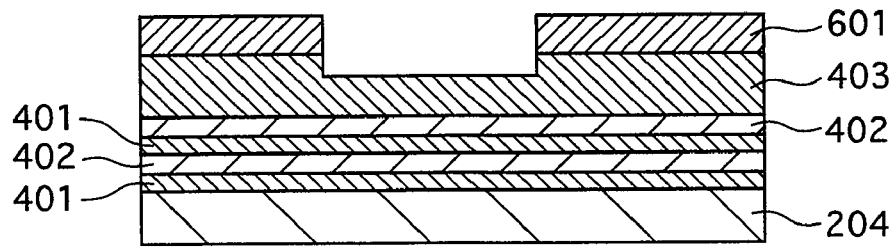

Next, as shown in FIG. 6B, a resist pattern 601 is formed by applying resist onto the silicon nitride layer 403, performing pre-exposure baking (prebaking), performing light exposure using a light exposure device such as a stepper, developing the resist, and performing final baking (postbaking).

Then, etching is performed using a CF4-based etching gas such that portions of the silicon nitride layer 403 not covered by the resist pattern 601 have an appropriate film thickness for the spacer layer in the red portions of the color filter 306. Thereafter, the resist pattern 601 is eliminated.

Figure 6C:
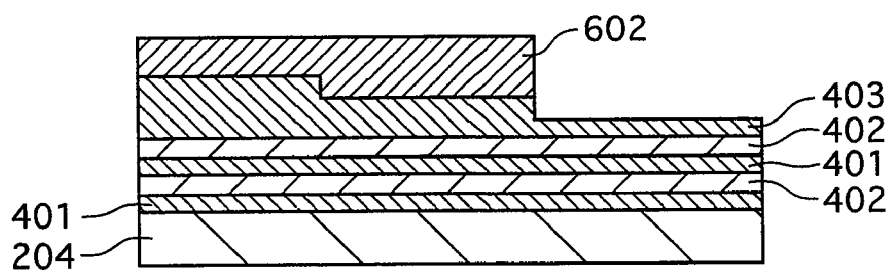

Similarly, a resist pattern 602 is formed on the silicon nitride layer 403, the silicon nitride layer 403 is etched so as to have a film thickness appropriate for the spacer layer in the green portions of the color filter 306, and thereafter the resist pattern 602 is eliminated (FIG. 6C).

Figure 6D:
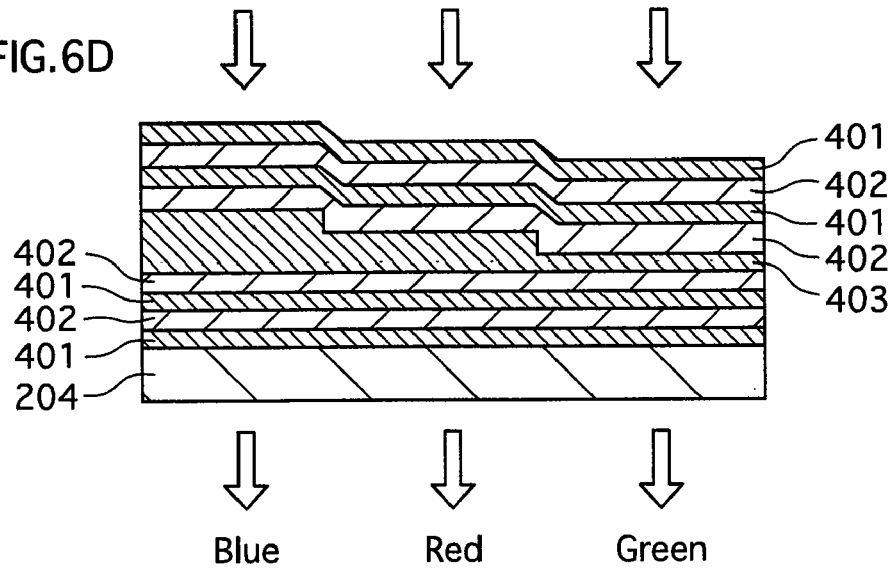

Then, as shown in FIG. 6D, the high frequency sputter device is used to alternately form the silicon oxide layers 402 and the silicon nitride layers 401 on the silicon nitride layer 403. These silicon nitride layers 401 and silicon oxide layers 402 form the $\lambda/4$ multilayer film 410.

Note that the total film thicknesses of the multilayer film structure composed of dielectric layers are 622 nm, 542 nm and 562 nm for R, G and B respectively.

This completes the description of the steps in which the color filter 306 is manufactured.

5. Spectroscopic Properties of the Color Filter 306

The following describes the spectroscopic properties of the color filter 306.

Figure 7:
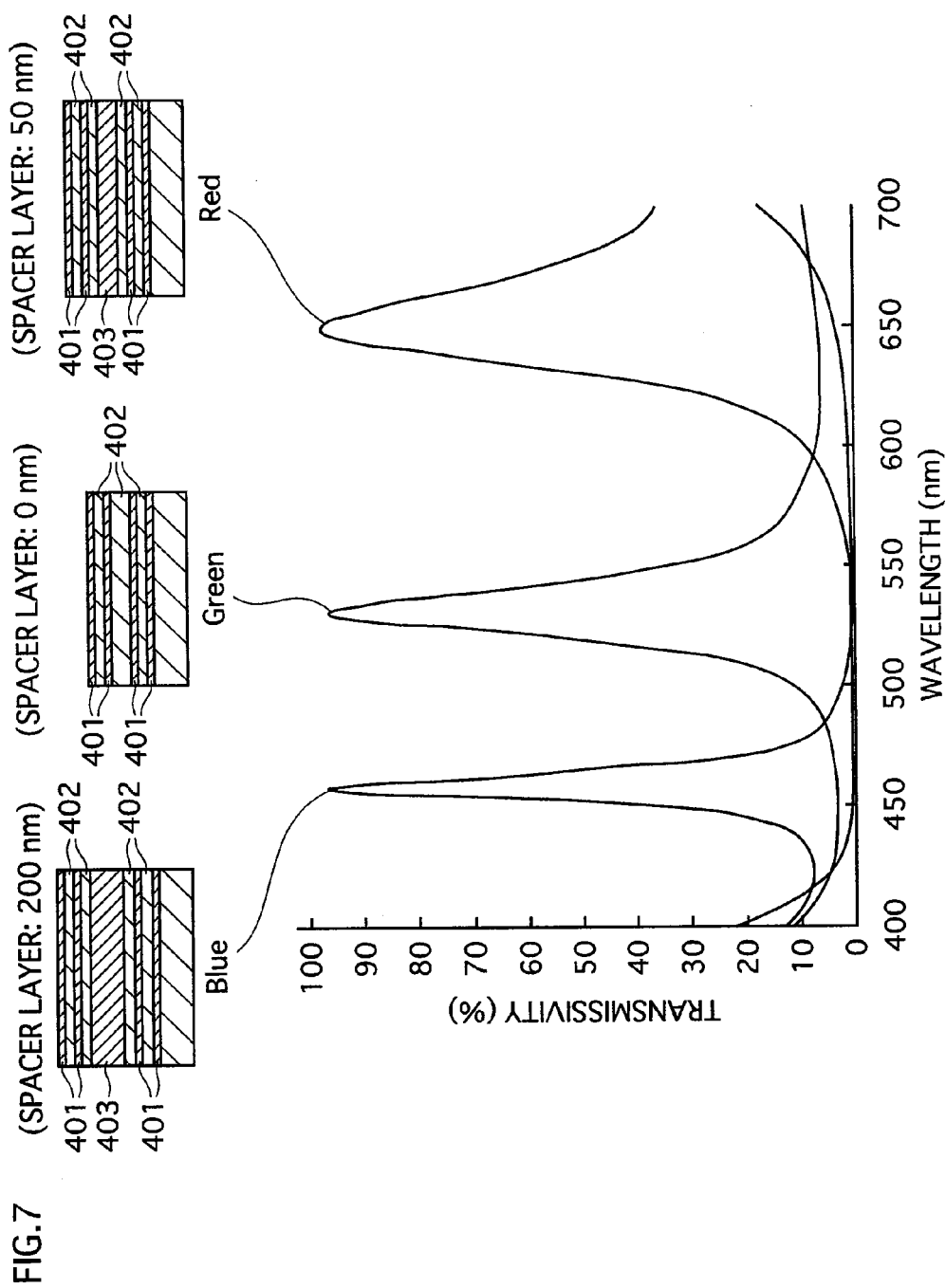
FIG. 7 is a graph showing spectroscopic properties of the color filter 306 pertaining to embodiment 1 of the present invention.

FIG. 7 is a graph showing the spectroscopic properties of the color filter 306. Here, the color filter 306 is composed of the spacer layer 403 formed from titanium oxide and alternately laminated high refractive index layers 401 formed from titanium oxide and low refractive index layers 402 formed from silicon oxide.

The optical thicknesses (film thicknesses) of the spacer layer 403 in the blue, green and red portions of the color filter 306 are 200 nm (80 nm), 0 nm (0 nm) and 50 nm (20 nm) respectively. Note that the green portion may be considered to include a spacer layer that is composed of silicon oxide and has an optical thickness of 275 nm.

As shown in FIG. 7, the different transmissivity properties (transmission peak wavelengths) of the color filter 306 are achieved by changing the film thickness of the spacer layer 403. Therefore, using the color filter 306 enables separating light into red, green and blue wavelengths needed for color imaging by the vehicle-mounted imaging device. Note that the above graph was also obtained using a characteristic matrix method.

6. Materials of the Color Filter 306

Note that the high refractive index material of the color filter may be titanium oxide, silicon nitride (SiN), tantalum oxide ($Ta_2O_5$), zirconium oxide ($ZrO_2$), or the like. Also, the low refractive index material may be a material other than silicon oxide as long as it has a lower refractive index than the material used in the high refractive index layer.

The spacer layer material may be the high refractive index layer material or the low refractive index layer material. Alternatively, the spacer layer material may be a material different from the high and low refractive index layers.

Given that organic pigments are conventionally used in color filters, the color filters must be formed in a so-called on-chip process after the light reception units etc. have been formed in a semiconductor process. In contrast, the color filter can be manufactured in a semiconductor process if dielectric materials are used for the high refractive index layers, the low refractive index layers and the spacer layer, thereby stabilizing the manufacturing process for the color filter, improving productivity, and lowering manufacturing cost.

Also, although organic pigment-based color filters experience color fading and a reduction in wavelength separation function when exposed to high temperatures and direct sunlight, there is no such reduction in wavelength separation function in a color filter composed of dielectric materials. This makes color filters composed of dielectric materials suitable for use in a vehicle-mounted imaging device.

Embodiment 2

The following describes embodiment 2 of the present invention. Although nearly the same as the driving assistance system of embodiment 1, the structure of the driving assistance system of embodiment 2 differs with respect to the structure of the spacer layer included in the color filter.

Specifically, whereas the spectroscopic properties of the color filter are changed by changing the film thickness of the spacer layer in embodiment 1, in the present embodiment the material of the spacer layer is varied along a direction of a wafer main surface. This enables obtaining the same effects as when the film thickness of the spacer layer is changed. The following description focuses mainly on aspects of the present embodiment that differ from embodiment 1.

FIGS. 8A to 8E show a manufacturing method for the color filter pertaining to the present embodiment, where the manufacturing steps proceed from FIG. 8A to 8E.

Figure 8A:
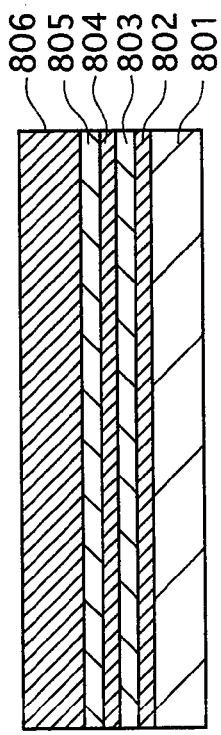
FIGS. 8A to 8E show a manufacturing method for a color filter pertaining to embodiment 2 of the present invention.

First, as shown in FIG. 8A, dielectric layers 802 to 805 that compose a $\lambda/4$ multilayer film are successively laminated on an interlayer insulation film 801, and a dielectric layer 806 that is to compose a spacer layer is formed thereon. The dielectric layers 802 to 805 are formed such that their optical film thicknesses are all ¼ of a set central wavelength. Also, the dielectric layer 806 is formed so as to have a film thickness that is appropriate for the spacer layer in the blue portion.

Figure 8B:
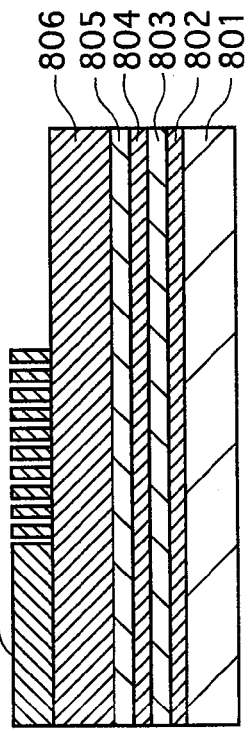

Next, as shown in FIG. 8B, a resist pattern 807 is formed on the dielectric layer 806. The resist pattern is formed in the same way described in embodiment 1.

In this case, the resist pattern 807 is formed in stripes in the red portion, and in a plan view of the red portion, an area ratio of areas with and without the resist pattern 807 is 1:4. Whereas the resist pattern 807 covers an entire surface of the blue portion, none of the red portion is covered by the resist pattern 807.

Figure 8C:
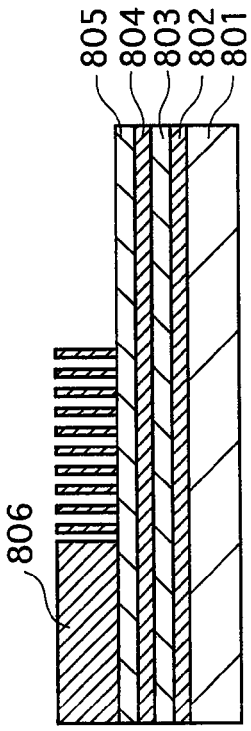

Then, as shown in FIG. 8C, a CF4-based etching gas is used to eliminate portions of the dielectric spacer layer 805 that are not covered by the resist pattern 807 until the dielectric layer 805 is exposed.

Figure 8D:
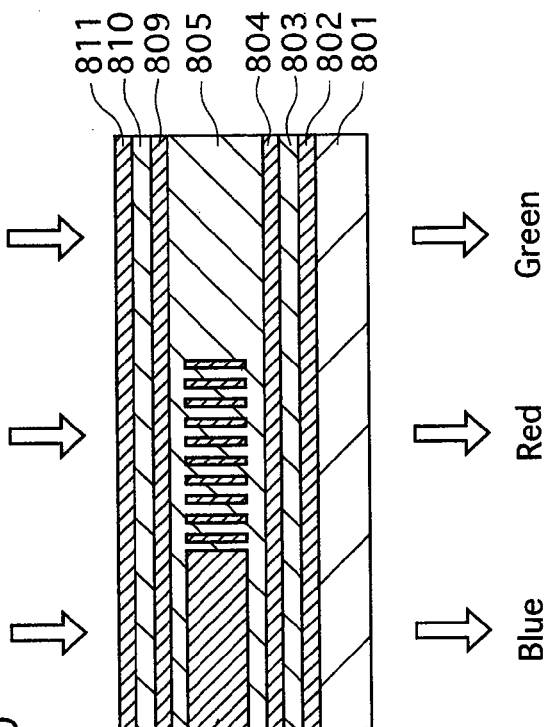
Figure 8E:
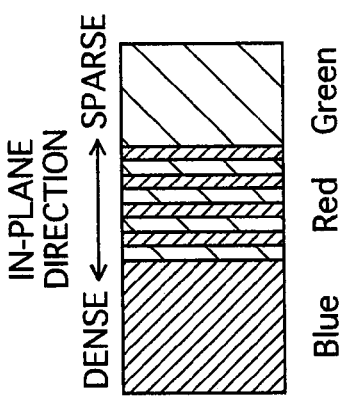

Thereafter, as shown in FIG. 8D, a dielectric layer 808 is formed on the dielectric layer 806 in the blue portion, on the dielectric layer 805 in the green portion, and on the dielectric layers 805 and 806 in the red portion. Furthermore, dielectric layers 809 to 811 are successively laminated on the dielectric layer 808 to form a $\lambda/4$ multilayer film.

According to this method, the dielectric layers 806 and 807 that have different refractive indices are formed in the red portion in stripes in a ratio of 1:4 in a plan view, thereby obtaining the same transmissivity properties as the color filter of embodiment 1, which is provided with a spacer layer that has a film thickness of 20 nm.

Also, microlenses can be easily formed on the color filter since the film thickness thereof is the same regardless of the color of light to be selectively transmitted.

Also, the ability to form the color filter in a semiconductor process stabilizes the manufacturing process for the color filter, improves productivity, and lowers manufacturing cost. Also, color fading does not occur even under high temperatures, high irradiation, and other such conditions since the color filter is constituted from inorganic materials. The color filter is therefore suitable for vehicle mounting due to the ability to be disposed anywhere, including in the passenger compartment and engine compartment, and outside the vehicle.

Embodiment 3

The following describes embodiment 3 of the present invention. Although nearly the same as the driving assistance system of embodiment 1, the structure of the driving assistance system of embodiment 3 differs in that the color filter focuses incident light. The following description focuses mainly on aspects of the present embodiment that differ from embodiment 1.

1. Structure of the Color Filter

Figure 9:
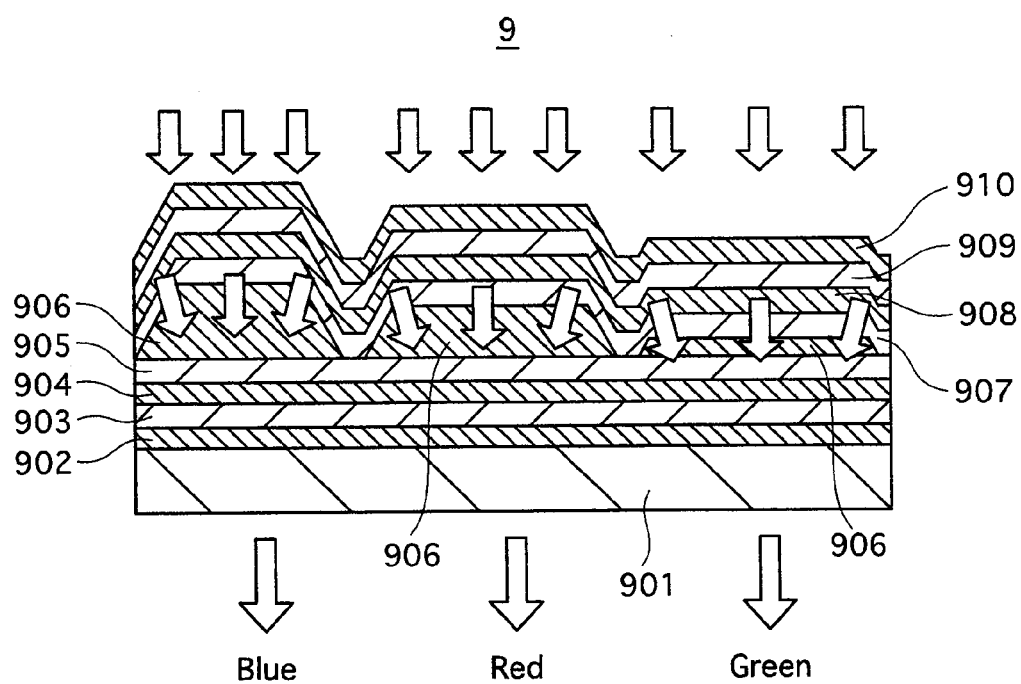
FIG. 9 is a cross-sectional view showing a structure of a color filter pertaining to embodiment 3 of the present invention.

First is a description of a structure of the color filter pertaining to the present embodiment. FIG. 9 is a cross-sectional view showing the structure of the color filter pertaining to the present embodiment.

As shown in FIG. 9, a color filter 9 of the present embodiment includes dielectric layers 902 to 910 successively laminated on an interlayer insulation film 901. The dielectric layers 902 to 910 form a multilayer interference filter composed of alternately laminated silicon oxide layers and titanium oxide layers.

The dielectric layer 906 corresponds to the spacer layer in the multilayer interference filters and a cross-section of the dielectric layer 906 is trapezoidal in shape. Also, the dielectric layers 907 to 910 that have been laminated on the dielectric layer 906 are curved. As a result, the dielectric layers 906 to 910 can refract and focus incident light.

Also, similarly to the other embodiments, the ability to form a color filter that focuses light in a semiconductor process stabilizes the manufacturing process for the color filter, improves productivity, and lowers manufacturing cost.

2. Manufacturing Method for the Color Filter 9

The following describes a manufacturing method for the color filter 9.

FIGS. 10A to 10F show cross-sectional views of the color filter 9 in the manufacturing process, where the manufacturing steps proceed from FIG. 10A to 10F.

Figure 10D:
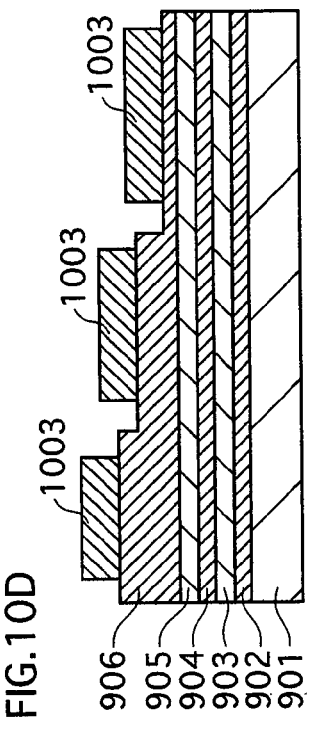
FIGS. 10A to 10F show cross-sectional views of a color filter 9 pertaining to embodiment 3 of the present invention, during a manufacturing method for the color filter 9.
Figure 10E:
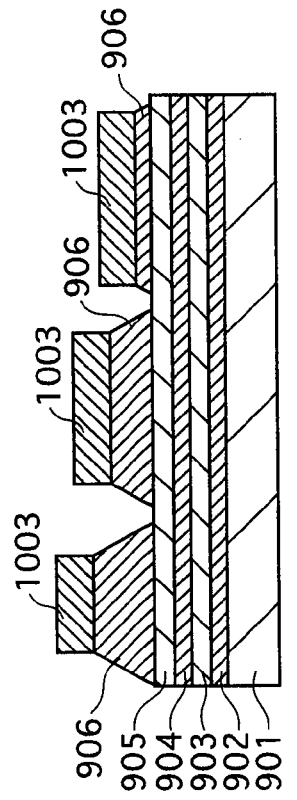
Figure 10F:
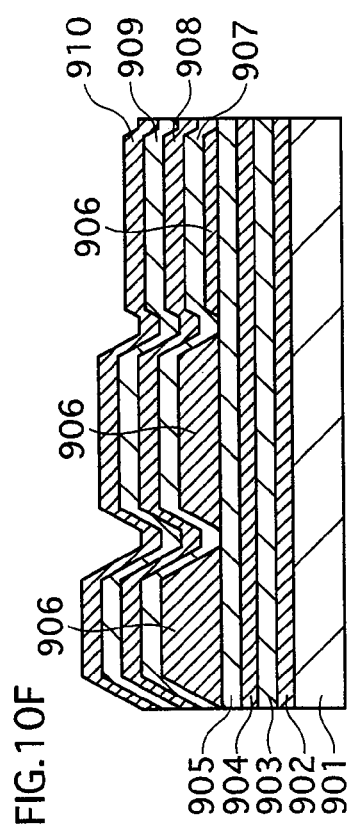
Figure 10A:
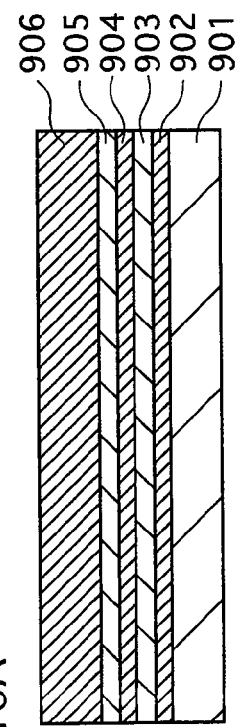

First in the manufacture of the color filter 9, as shown in FIG. 10A, a high frequency sputter device is used to form the dielectric layers 902 to 906 on the interlayer insulation film 901.

Figure 10B:
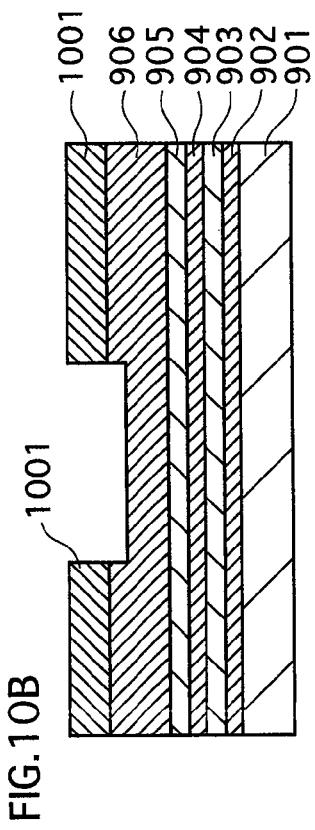

Next, as shown in FIG. 10B, a resist pattern 1001 is formed on the dielectric layer 906 in a photolithography step, and etching is performed in a dry etching step such that the film thickness of the dielectric layer 906 in the red portion is appropriate as the film thickness of the spacer layer in the red portion.

Figure 10C:
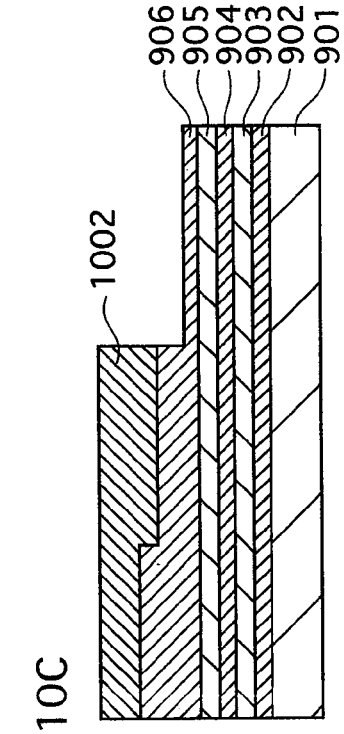

Similarly, as shown in FIG. 10C, a resist pattern 1002 is formed on the dielectric layer 906 in a photolithography step, and etching is performed in a dry etching step such that the film thickness of the dielectric layer 906 in the green portion is appropriate as the film thickness of the spacer layer in the green portion.

Next, as shown in FIG. 10D, a resist pattern 1003 is formed on center portions of the red portion, the green portion and the blue portion of the dielectric layer 906 in a photolithography step, and the peripheries of the portions are given a tapered shape by etching the dielectric layer 906 in a dry etching step (FIG. 10E).

Thereafter, as shown in FIG. 10F, the high frequency sputter device is used to successively laminate the dielectric layers 907 to 910 on the dielectric layer 906, thereby completing the color filter 9.

3. Variation of the Manufacturing Method for the Color Filter 9

The color filter 9 can also be manufactured by a method such as the following.

FIGS. 11A to 11F show cross-sectional views of the color filter 9 during another manufacturing method, where the manufacturing steps proceed from FIG. 11A to 11F.

Figure 11A:
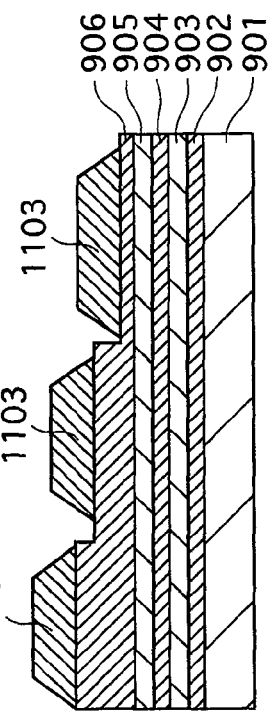
FIGS. 11A to 11F show cross-sectional views of the color filter 9 pertaining to embodiment 3 of the present invention, during another manufacturing method for the color filter 9.
Figure 11B:
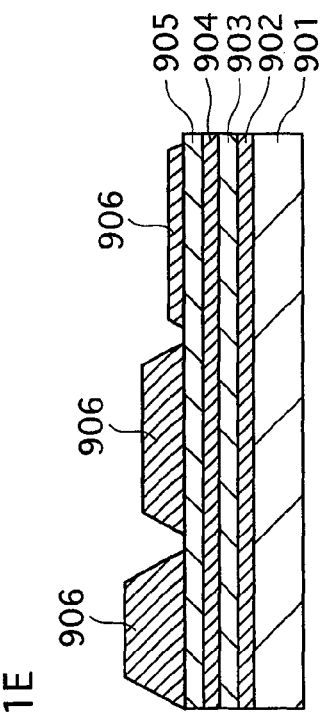
Figure 11C:
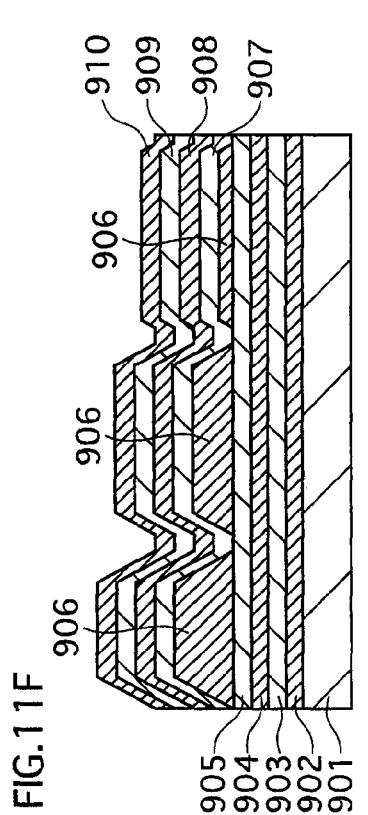

Specifically, first the high frequency sputter device is used to form the dielectric layers 902 to 906 on the interlayer insulation film 901 (FIG. 11A), the red portion of the dielectric layer 906 is etched with use of a resist pattern 1101 (FIG. 11B), and the green portion of the dielectric layer 906 is etched with use of a resist pattern 1102 (FIG. 11C).

Figure 11D:
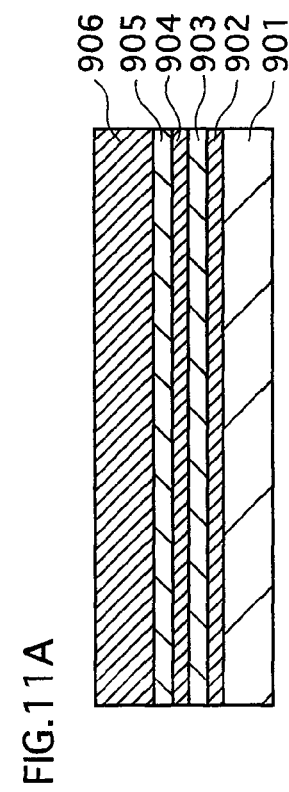
Figure 11E:
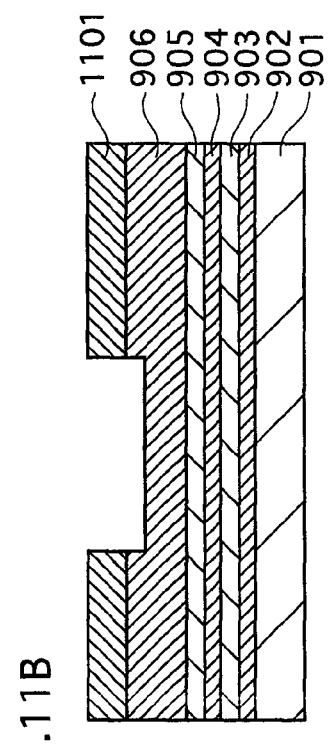

Next, as shown in FIG. 11D, a resist pattern 1103 is formed on the red, green and blue portions of the dielectric layer 906 in a photolithography step. The resist pattern 1103 is formed so as to have tapered peripheries. Etching the dielectric layer 906 with use of the resist pattern 1103 enables forming the tapered peripheries of the red, green and blue portions of the dielectric layer 906 (FIG. 11E).

Figure 11F:
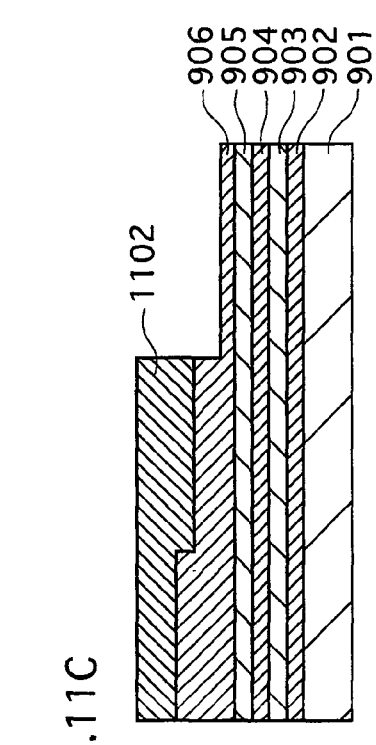

Thereafter, as shown in FIG. 11F, the high frequency sputter device is used to successively laminate the dielectric layers 907 to 910 on the dielectric layer 906, thereby completing the color filter 9.

Embodiment 4

The following describes embodiment 4 of the present invention.

Although nearly the same as the driving assistance system of embodiment 1, the structure of the driving assistance system of embodiment 4 differs in that the wavelength separation function of the color filter is further improved by adjusting the film thicknesses of the spacer layer of the multilayer interference filter that constitutes the color filter. The following description focuses mainly on aspects of the present embodiment that differ from embodiment 1.

1. Structure of the Color Filter

Figure 12:
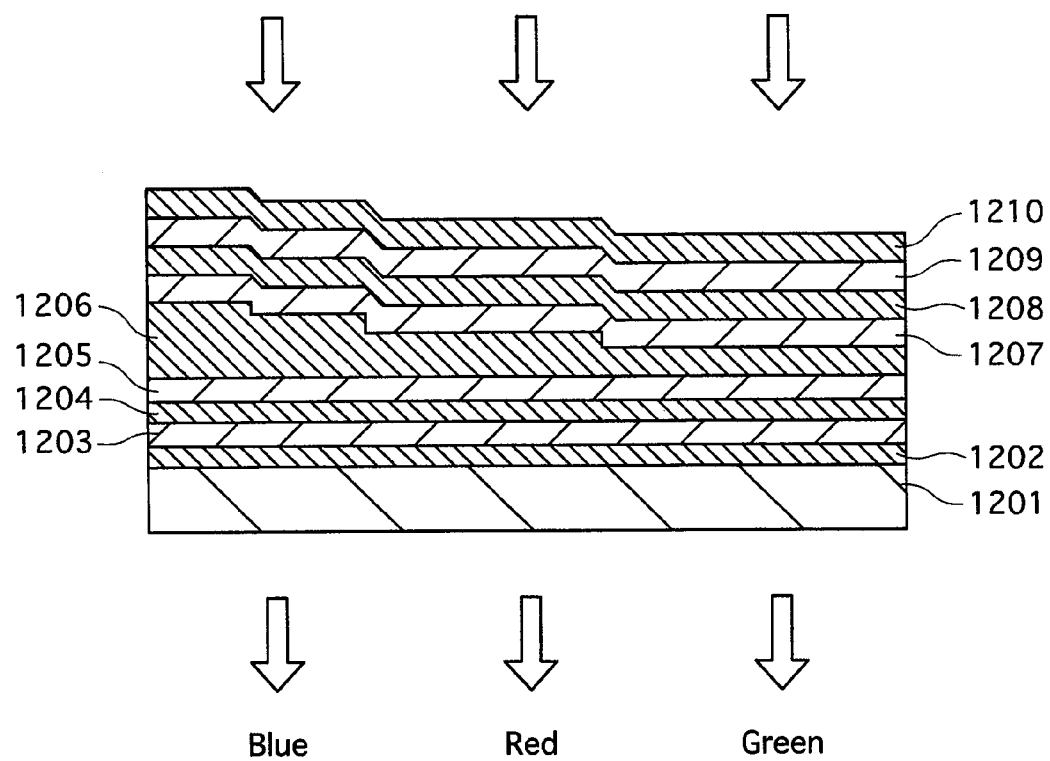
FIG. 12 is a cross-sectional view showing a structure of a color filter pertaining to embodiment 4 of the present invention.

First, is a description of the structure of the color filter included in the driving assistance system pertaining to the present embodiment. FIG. 12 is a cross-sectional view showing a structure of the color filter pertaining to the present embodiment. As shown in FIG. 12, a color filter 12 includes dielectric layers 1202 to 1210 that have been successively laminated on an interlayer insulation film 1201.

The dielectric layers 1202 to 1205 and the dielectric layers 1207 to 1210 form the two $\lambda/4$ multilayer films, and the dielectric layers 1202 to 1210 as a whole form the multilayer interference filter, where the dielectric layer 1206 is the spacer layer.

The film thickness of the spacer layer 1206 is different in the red, green and blue portions of the color filter 12, and furthermore, is different within the blue portion.

2. Manufacturing Method for the Color Filter 12

The following describes a manufacturing method for the color filter 12. FIGS. 13A to 13E show cross-sectional views of the color filter 12 during steps in the manufacturing method.

Figure 13A:
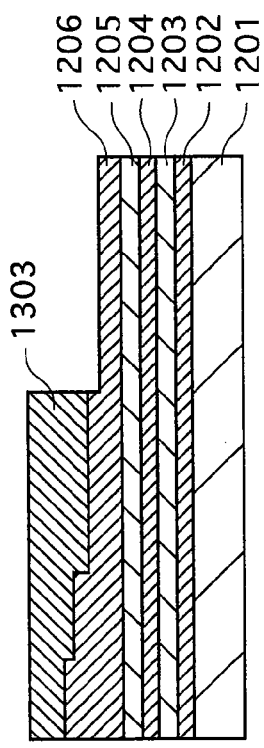
FIGS. 13A to 13E show cross-sectional views of a color filter 12 pertaining to embodiment 4 of the present invention, during steps in a manufacturing method for the color filter 12.

As shown in FIG. 13A, first the dielectric layers 1202 to 1206 are successively laminated on the interlayer insulation film 1201. In this case, the dielectric layer 1206 is formed so as to have a film thickness appropriate as the thickest portion of the spacer layer.

Figure 13B:
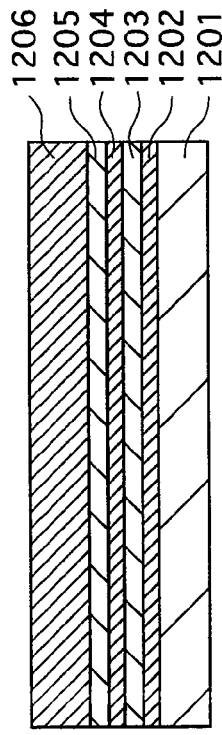
Figure 13C:
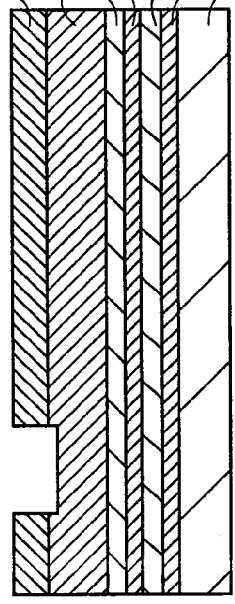
Figure 13D:
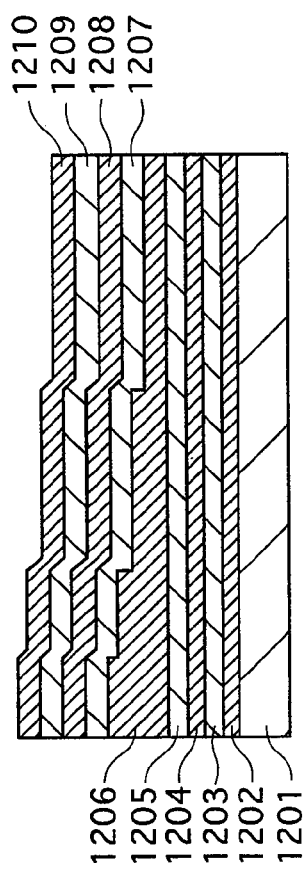

Then, the dielectric layer 1206 is etched with use of resist patterns 1301 to 1303 to achieve the appropriate film thicknesses for the red, green and blue portions (FIG. 13B to 13D).

Figure 13E:
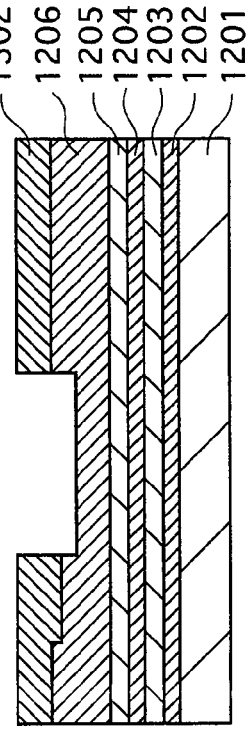

Thereafter, the dielectric layers 1207 to 1210 are successively laminated on the dielectric layer 1206, thereby obtaining the color filter 12 (FIG. 13E).

3. Effects

When the film thickness of the spacer layer is the same within each of the portions, the blue portion has a narrower transmission band than the other portions. In contrast, in the present embodiment, the film thickness of the spacer layer is varied within the blue portion to widen the transmission band of the blue portion, thereby improving the sensitivity of the imaging device.

Embodiment 5

The following describes embodiment 5 of the present invention. Although nearly the same as the driving assistance system of embodiment 1, the structure of the driving assistance system of embodiment 5 differs in that the film thickness of the spacer layer in the multilayer interference filter that forms the color filter is varied contiguously. The following description focuses mainly on aspects of the present embodiment that differ from embodiment 1.

1. Structure of the Color Filter

Figure 14:
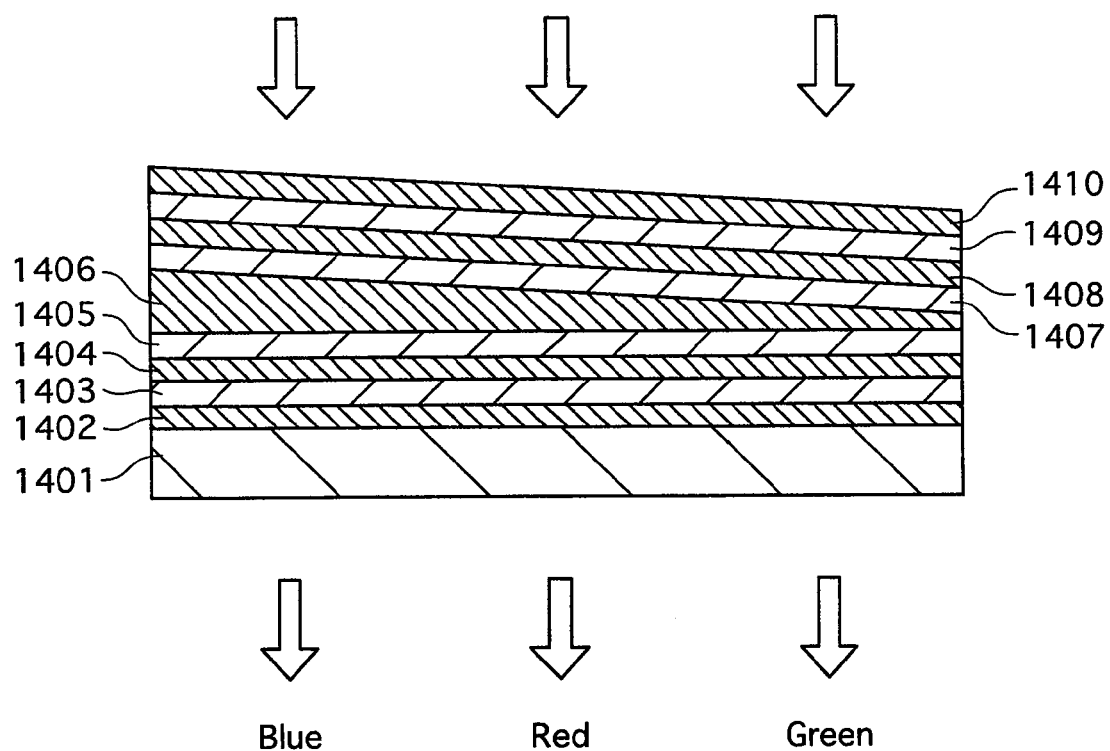
FIG. 14 is a cross-sectional view showing a structure of a color filter pertaining to embodiment 5 of the present invention.

First is a description of the structure of the color filter included in the driving assistance system pertaining to the present embodiment. FIG. 14 is a cross-sectional view showing the structure of the color filter pertaining to the present embodiment. As shown in FIG. 14, the color filter 14 includes dielectric layers 1402 to 1410 that have been successively laminated on an interlayer insulation film 1401.

The dielectric layers 1402 to 1405 and the dielectric layers 1407 to 1410 form the two $\lambda/4$ multilayer films, and the dielectric layers 1402 to 1410 as a whole form the multilayer interference filter, where the dielectric layer 1406 is the spacer layer.

The dielectric layers 1402, 1404, 1406, 1408, and 1410 are composed of titanium oxide, and the dielectric layers 1403, 1405, 1407, and 1409 are composed of silicon oxide.

The film thickness of the spacer layer 1406 is varied contiguously so as to be thickest in the blue portion, thinner in the red portion and further thinner in the green portion. Also, the film thickness of the spacer layer is varied contiguously within each of the portion. This enables further widening the transmission band of each of the portions.

2. Manufacturing Method for the Color Filter 14

The following describes a manufacturing method for the color filter 14. FIGS. 15A to 15D show cross-sectional views of the color filter 14 during steps in the manufacturing method.

As shown in FIG. 15A, first a high frequency sputter device is used to successively laminate the dielectric layers 1402 to 1406 on the interlayer insulation film 1401. In this case, the dielectric layer 1406 is formed so as to have a film thickness appropriate as the thickest portion of the spacer layer.

Next, a tapered resist pattern 1501 is formed in a photolithography step (FIG. 15B). In the photolithography step, the resist pattern 1501 is tapered by varying the transmissivity of a chromium (Cr) film formed on the resist pattern 1501.

Then, the dielectric layer 1406 is etched into a tapered shape in a dry etching step that uses an etching gas such as CF4 (FIG. 15C).

Thereafter, the dielectric layers 1407 to 1410 are successively laminated on the dielectric layer 1406, thereby obtaining the color filter 14 (FIG. 15D).

Variations

Although described above based on the embodiments, the present invention is of course not limited to the above-described embodiments. Variations such as the following can be practiced.

(1) Although not mentioned in particular in the above embodiments, imaging devices are damaged relatively less during an accident, such as a collision, when disposed in the passenger or engine compartment rather than on the outside of the vehicle. In view of this, cameras disposed in the passenger and engine compartments may monitor the vehicle's exterior. This enables more reliably keeping a video record of conditions during an accident.

(2) Although not mentioned in particular in the above embodiments, a planarizing film may be formed on the color filter. This enables more precisely forming the microlenses, thereby reducing variations in light-focusing efficiency to realize superior image quality.

(3) Although a case of using titanium oxide as the high refractive index material is described in the above embodiments, the present invention is of course not limited to this. Alternatively, silicon nitride (SiN), tantalum oxide ($Ta_2O_5$), zirconium oxide ($ZrO_2$), or the like may be used.

A material other than silicon oxide may be used as the low refractive index material, provided the material has a lower refractive index than the high refractive index material. Also, instead of the high refractive index material, the low refractive index may be used as the spacer layer material, or a material other than the high and low refractive index materials may be used.

(4) Although a case in which the spacer layer has two levels of film thicknesses in the blue portion is described in embodiment 4, the present invention is of course not limited to this. Alternatively, the spacer layer may have three or more levels of film thicknesses. Also, the spacer layer may be formed so as to have different film thicknesses within the red and green portions as well. This enables adjusting the transmission bandwidth in each of the portions, thereby making it possible to realize further superior wavelength separation.

(5) Although a case in which the spacer layer exists in all of the portions of the color filter is described in the above embodiments, the present invention is of course not limited to this. Depending on the transmission band, two $\lambda/4$ multilayer films may be laminated without the spacer layer.

In this case, it can be said that there is a spacer layer that has an optical thickness of $\lambda/2$ and is composed of a material different from the other portions since the same-material dielectric layers of the two $\lambda/4$ multilayer films would be in contact with each other.

This is also effective in terms of manufacturing since such a portion can be formed at the same time as the other portions of the color filter in a semiconductor process.

(6) Although not mentioned in particular in the above embodiments, the automobile in the description is of course not limited to a passenger car. Beside passenger vehicles, the automobile refers to a wide variety of general surface-traveling vehicles.

(7) Although a driving assistance system has been described as an example in the above embodiments, the present invention is of course not limited to this. Alternatively, the vehicle-mounted imaging device of the present invention may be applied to another vehicle-mounted system. The effects of the invention can be obtained regardless of to which vehicle-mounted system the vehicle-mounted imaging device of the present invention is applied.

INDUSTRIAL APPLICABILITY

A vehicle-mounted imaging device of the present invention is useful as a device that can be mounted to an automobile, withstand a harsh environment, and image the interior and exterior of the automobile.

The invention claimed is:

1. A vehicle-mounted imaging device that is mounted to an automobile and performs color imaging, the vehicle-mounted imaging device including a plurality of two-dimensionally arranged pixel cells, each pixel cell comprising of a photodiode formed on a semiconductor substrate and a color filter formed on the photodiode, wherein:

the color filter includes a layered structure and is composed of an inorganic material, the color filter is configured to selectively transmit a wavelength of incident light, and the vehicle-mounted imaging device is mounted in an engine compartment of the automobile.

2. The vehicle-mounted imaging device of claim 1, wherein the vehicle-mounted imaging device is configured to monitor condition of at least one of an engine, a transmission, a suspension, and a tire.

3. The vehicle-mounted imaging device of claim 1, outputting signals input to a video control device, wherein another vehicle-mounted imaging device mounted in a passenger compartment of the automobile also outputs signals input to the video control device.

* * * * *